United States Patent
Lollio et al.

(10) Patent No.: US 8,164,383 B1
(45) Date of Patent: Apr. 24, 2012

(54) CIRCUITS AND METHODS FOR AMPLIFYING SIGNALS

(75) Inventors: Alex Lollio, Costa Volpino (IT); Giacomino Bollati, Castel San Giovanni (IT); Rinaldo Castello, Arcore (IT)

(73) Assignee: Marvell International Ltd., Hamilton (BM)

(*) Notice: Subject to any disclaimer, the term of this patent is extended or adjusted under 35 U.S.C. 154(b) by 19 days.

(21) Appl. No.: 12/896,586

(22) Filed: Oct. 1, 2010

Related U.S. Application Data

(60) Provisional application No. 61/247,911, filed on Oct. 1, 2009.

(51) Int. Cl.
*H03F 1/14* (2006.01)

(52) U.S. Cl. .................. 330/51; 330/124 R; 330/310

(58) Field of Classification Search .......... 330/296–297, 330/51, 295, 124 R, 286, 84, 310, 133, 98, 330/150
See application file for complete search history.

(56) References Cited

U.S. PATENT DOCUMENTS

| | | | |
|---|---|---|---|
| 7,196,577 B2 * | 3/2007 | Brunner | 330/86 |
| 7,444,124 B1 * | 10/2008 | Loeb et al. | 455/127.3 |

OTHER PUBLICATIONS

"1V, Low-Power, DirectDrive, Stereo Headphone Amplifier with Shutdown", MAX9725 Data sheet, Mar. 2009, Maxim Integrated Products, Sunnyvale, CA.

Peter Bogner et al., "A High Signal Swing Class AB Earpiece Amplifier in 65nm CMOS Technology", IEEE, 2006, Infineon Technologies Austria, Villach, Austria.

"Class G Headphone Amplifier with I2C Volume Control", LM48824 Data sheet, Aug. 31, 2009, National Semiconductor, Sunnyvale, CA.

"Class-G DirectPath Stereo Headphone Amplifier", TPA6141A2 Data sheet, Mar. 2009, Texas Instruments Inc., Dallas, TX.

Vijay Dhanasedaran et al., "Design of Three-Stage Class-AB 16 Headphone Driver Capable of Handling Wide Range of Load Capacitance", IEEE Journal of Solid-State Circuits, vol. 44, No. 6, Jun. 2009.

* cited by examiner

*Primary Examiner* — Hieu Nguyen

(57) ABSTRACT

In one embodiment, the present disclosure includes an amplifier comprising first and second output stages. The first output stage receives first power supply voltages and the second output stage receives second power supply voltages greater than the first power supply voltages. A switching stage configures the output stages to provide a first current to an amplifier output node from the first output stage when a magnitude of a voltage on the output node is below a first value, provide a second current to the output node from the second output stage when the magnitude of the voltage on the output node is above a second value greater than the first value, and provide a third current to the output node from both the first output stage and the second output stage when the magnitude of the voltage on the output node is between the first value and the second value.

21 Claims, 13 Drawing Sheets

CIRCUITS AND METHODS FOR AMPLIFYING SIGNALS

CROSS REFERENCE TO RELATED APPLICATIONS

The present disclosure claims the benefit of priority from U.S. Provisional Application No. 61/247,911, filed Oct. 1, 2009, the disclosure of which is incorporated herein by reference in its entirety.

BACKGROUND

The present disclosure relates to circuits and methods for amplifying signals.

Unless otherwise indicated herein, the approaches described in this section are not prior art to the claims in this application and are not admitted to be prior art by inclusion in this section.

Many electronic systems process electronic signals for a variety of purposes. In some electronic systems, electronic signals may represent real world phenomena such as sounds (audio) or images (video). Other electronic systems may process electronic signals pertaining to operating conditions of the system, for example. A basic building block of many electronic systems is the amplifier. Amplifiers may be used to change particular parameters of the electronic signals. For example, amplifiers may be used to increase voltage, current, or power.

One challenge with constructing an amplifier circuit is maintaining the integrity of the electronic signal being processed. For example, amplifier circuits may introduce undesirable distortion or noise in the electronic signal. Such distortion or noise may degrade the performance of the electronic system using the signal. Another challenge with building amplifier circuits pertains to power consumption. Many amplifiers may have high signal integrity, but may consume large amounts of power to maintain such integrity. Such inefficient amplifiers may not be useful for battery operated applications, such as portable phones or other similar devices, for example.

SUMMARY

Embodiments of the present disclosure improved amplifier circuits. In one embodiment, the present invention includes an amplifier circuit comprising a input stage to receive an input signal, a first output stage coupled to a first output of the input stage, wherein the first output stage is configured to receive first power supply voltages, a second output stage coupled to the first output of the input stage, wherein the second output stage is configured to receive second power supply voltages, wherein a first voltage difference between the first power supply voltages is less than a second voltage difference between the second power supply voltages, an output node coupled to an output of the first output stage and an output of the second output stage, and a switching stage to receive an input from the output node and provide outputs to the first output stage and the second output stage to configure the first output stage and the second output stage to provide a first current to the output node exclusively from the first output stage when a magnitude of a voltage on the output node is below a first value, provide a second current to the output node exclusively from the second output stage when the magnitude of the voltage on the output node is above a second value greater than the first value, and provide a third current to the output node from both the first output stage and the second output stage when the magnitude of the voltage on the output node is between the first value and the second value.

In one embodiment, the switching stage comprises a soft switching circuit to progressively turn off the first output stage and the second output stage based on the voltage on the output node and a hard switching circuit to turn off the first output stage and the second output stage based the voltage on the output node.

In one embodiment, the soft switching circuit progressively reduces current from the first output stage as the magnitude of the voltage on the output node increases above the first value and progressively reduces current from the second output stage as the magnitude of the voltage on the output node decreases below the second value greater than the first value.

In one embodiment, the hard switching circuit turns off the first output stage when the magnitude of the voltage on the output node is greater than a third value greater than the first value and turns off the second output stage when the magnitude of the voltage on the output node is less than or equal to a fourth value less than the first value.

In one embodiment, the soft switching circuit comprises first differential transistors to receive the voltage on the output node and a first reference voltage, wherein the first reference voltage is generated from a positive voltage of the first power supply voltages minus a threshold voltage, a first current mirror coupled between a first output of the first differential transistors and a control input of a first output transistor in the first output stage between the positive voltage of the first power supply voltages and the output node, a second current mirror coupled between a second output of the first differential transistors and a control input of a second output transistor in the second output stage between the positive voltage of the second power supply voltages and the output node, second differential transistors to receive the voltage on the output node and a second reference voltage, wherein the second reference voltage is generated from a negative voltage of the first power supply voltages plus the threshold voltage, a third current mirror coupled between a first output of the second differential transistors and a control input of a third output transistor in the first output stage between a negative voltage of the first power supply voltages and the output node, and a fourth current mirror coupled between a second output of the second differential transistors and a control input of a fourth output transistor in the second output stage between a negative voltage of the second power supply voltages and the output node.

In one embodiment, the hard switching circuit comprises a first comparator having a first input to receive the voltage on the output node and a second input to receive a positive voltage of the first power supply voltages, and a second comparator having a first input to receive the voltage on the output node and a second input to receive a negative voltage of the first power supply voltages, the first comparator turns off a first output transistor in the first output stage when the voltage on the output node is greater than the positive voltage of the first power supply voltages, and the second comparator turns off a second output transistor in the first output stage when the voltage on the output node is less than the negative voltage of the first power supply voltages.

In one embodiment, the first and second comparators are hysteretic comparators.

In one embodiment, the first comparator selectively couples a first bulk material of the first output transistor to the output node when the voltage on the output node is greater than the positive voltage of the first power supply voltages, and wherein the second comparator selectively couples a second bulk material of the second output transistor to the output node when the voltage on the output node is less than the negative voltage of the first power supply voltages.

In one embodiment, the hard switching circuit comprises a first comparator having a first input to receive the voltage on the output node and a second input to receive a first voltage less than or equal to the first value, and a second comparator having a first input to receive the voltage on the output node and a second input to receive a second voltage equal to a negative of the first voltage, the first comparator turns off a first output transistor in the second output stage when the voltage on the output node is less than the first voltage, and wherein the second comparator turns off a second output transistor in the second output stage when the voltage on the output node is greater than the second voltage.

In one embodiment, the first output stage and the second output stage inject current into the output node.

In one embodiment, the first output stage comprises a first PMOS transistor and a first NMOS transistor configured in series between the first power supply voltages, the second output stage comprises a second PMOS transistor and a second NMOS transistor configured in series between the second power supply voltages, and the switching stage comprises a first differential transistor circuit, a second differential transistor circuit, and a plurality of comparators.

In one embodiment, the first output stage comprises a first transistor of first conductivity type and a second transistor of second conductivity type configured in series between the first power supply voltages, wherein first transistor and second transistor are biased by an active voltage bias circuit configured between a control terminal of the first transistor and a control terminal of the second transistor, and wherein the second output stage comprises a third transistor of first conductivity type and a fourth transistor of second conductivity type configured in series between the second power supply voltages, wherein third transistor and fourth transistor are biased by one or more previous stages.

In one embodiment, the circuit further comprises one or more intermediate stage between the input stage and the first and second output stages.

In one embodiment, the first output stage comprises a clamped active voltage bias circuit.

In another embodiment, the present invention includes an electronic system comprising an audio amplifier comprising a circuit as described herein.

In another embodiment, the present invention includes a method comprising receiving a signal in an input stage of an amplifier circuit, coupling the signal to a first output stage, wherein the first output stage is configured to receive first power supply voltages, coupling the signal to a second output stage, wherein the second output stage is configured to receive second power supply voltages, and wherein a first voltage difference between the first power supply voltages is less than a second voltage difference between the second power supply voltages, generating a voltage on an output node in response to the signal, wherein the output node is coupled to an output of the first output stage and an output of the second output stage, receiving the voltage on the output node in a switching stage, and reconfiguring the first output stage and the second output stage in response to outputs from the switching stage, where the first output stage and the second output stage are configured to provide a first current to the output node exclusively from the first output stage when a magnitude of a voltage on the output node is below a first value, where the first output stage and the second output stage are configured to provide a second current to the output node exclusively from the second output stage when the magnitude of the voltage on the output node is above a second value greater than the first value, and where the first output stage and the second output stage are configured to provide a third current to the output node from both the first output stage and the second output stage when the magnitude of the voltage on the output node is between the first value and the second value.

In one embodiment, the method further comprises progressively reducing current from the first output stage as the magnitude of the voltage on the output node increases above the first value and progressively reducing current from the second output stage as the magnitude of the voltage on the output node decreases below the second value greater than the first value.

In one embodiment, the method further comprises turning off the first output stage when the magnitude of the voltage on the output node is greater than a third value greater than or equal to the first value and turning off the second output stage when the magnitude of the voltage on the output node is less than or equal to a fourth value less than the first value.

In one embodiment, the method further comprises receiving the voltage on the output node and a first reference voltage in a first differential circuit, mirroring current to a control terminal of a first PMOS transistor in the first output stage and a control terminal of a second PMOS transistor in the second output stage based on the voltage on the output node, receiving the voltage on the output node and a second reference voltage in a second differential circuit, and mirroring current to a control terminal of a first NMOS transistor in the first output stage and a control terminal of a second NMOS transistor in the second output stage based on the voltage on the output node.

In one embodiment, the method further comprises receiving the voltage on the output node, a first reference voltage, and a second reference voltage in a first window comparator circuit, wherein the first reference voltage is greater than the second reference voltage, turning off a first PMOS transistor in the first output stage when the voltage on the output node is above the first reference voltage and turning off a first NMOS transistor in the first output stage when the voltage on the output node is below the second reference voltage, receiving the voltage on the output node, a third reference voltage, and a fourth reference voltage in a second window comparator circuit, wherein the third reference voltage is greater than the fourth reference voltage, and turning off a second PMOS output transistor and a second NMOS transistor in the second output stage when the voltage on the output node is between the third reference voltage and the fourth reference voltage.

The following detailed description and accompanying drawings provide a better understanding of the nature and advantages of the present invention.

DETAILED DESCRIPTION

Described herein are techniques for amplifying signals. In the following description, for purposes of explanation, numerous examples and specific details are set forth in order to provide a thorough understanding of particular embodiments. The circuits and methods disclosed herein may be used in a variety of electronic systems. Further, the circuits and methods describe herein may be implemented on an integrated circuit (IC). Circuits and methods described herein may be used to implement a class G amplifier in an electronic system, such as a mobile phone, personal digital assistant, mobile computer, mobile audio and/or video player, for example. Particular embodiments as defined by the claims may include some or all of the features in these examples alone or in combination with other features described below, and may further include modifications and equivalents of the features and concepts described herein.

Figure 1:
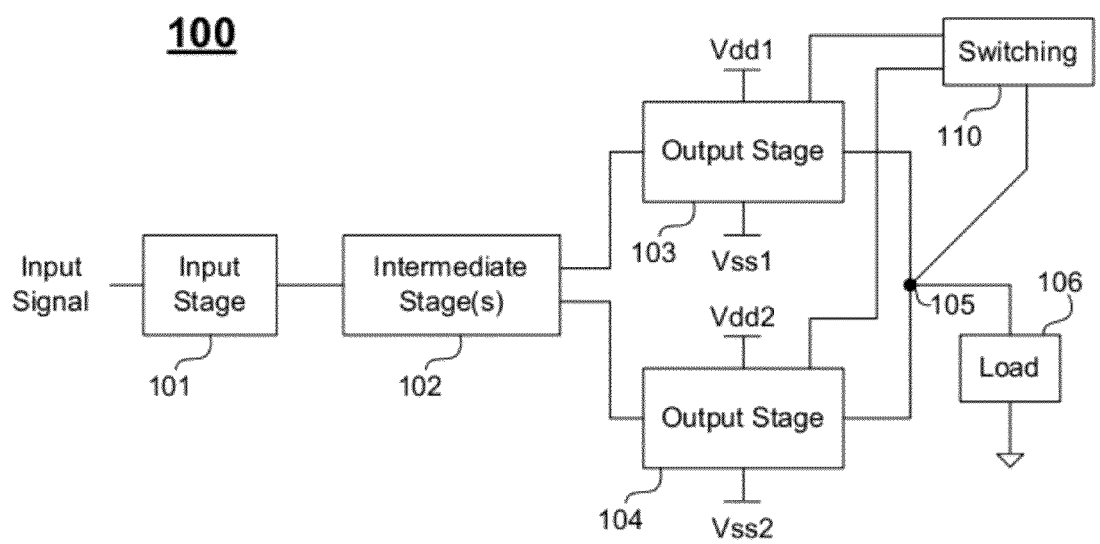
FIG. 1 illustrates an amplifier circuit according to one embodiment.

FIG. 1 illustrates an amplifier circuit 100 according to one embodiment. Amplifier circuit 100 includes an input stage 101, one or more intermediate stage 102, output stage 103, output stage 104, and switching stage 110. An input signal is received on an input of input stage 101. An output of input stage 101 is coupled through one or more intermediate stages 102 to output stage 103 and output stage 104. An output node 105 is coupled to an output of output stage 103 and to an output of output stage 104. A load 106 may be coupled to output node 105, for example. Output stage 103 may be configured in parallel with output stage 104, for example. Output stage 103 is configured to receive first power supply voltages Vdd1 and Vss1. Similarly, output stage 104 is configured to receive second power supply voltages Vdd2 and Vss2. A voltage difference between the first power supply voltages Vdd1 and Vss1 is less than a voltage difference between the second power supply voltages Vdd2 and Vss2. Switching stage 110 is coupled to receive an input from output node 105 and provide outputs to output stage 103 and output stage 104. For instance, a voltage on the output node 105 is received in the switching stage 110 to reconfigure output stage 103 and output stage 104 to provide current to output node 105. In some embodiments, switching stage 110 may include hard switching or soft switching, or both, as described in more detail below.

Figure 2A:
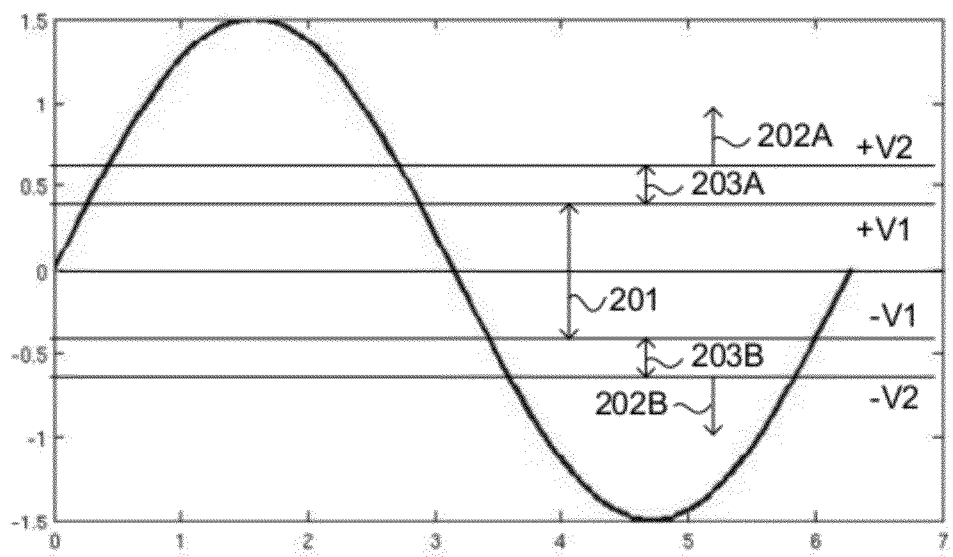
FIGS. 2A-B illustrate the operation of an amplifier circuit according to one embodiment.
Figure 2B:
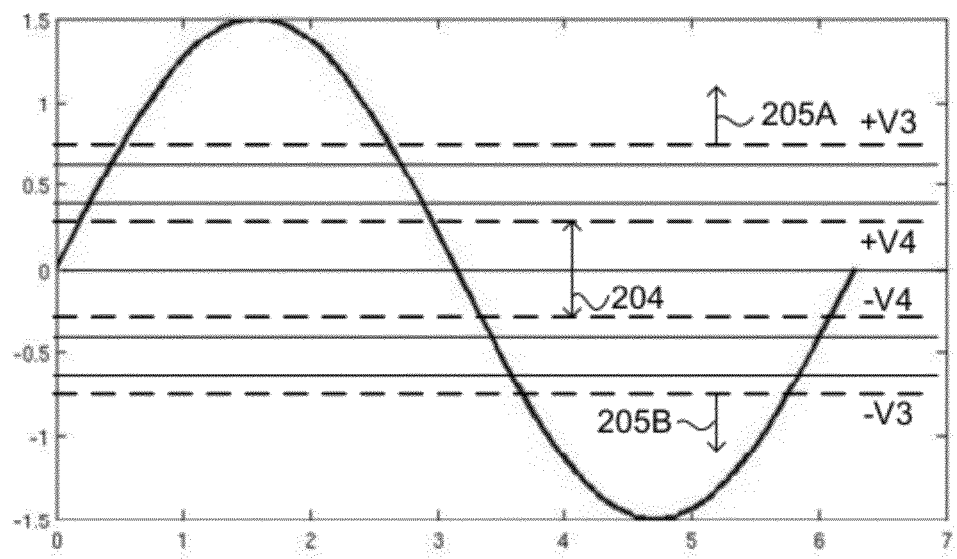

FIGS. 2A-B illustrate the operation of an amplifier circuit 100 according to one embodiment. Output stage 103 and output stage 104 are configured to provide a first current to output node 105 exclusively from the output stage 103 when a magnitude of a voltage on output node 105 is below a first value. As illustrated in FIG. 2A, when the voltage on output node 105 is less than +V1 and greater than −V1 (e.g., at region 201), current into output node 105 is exclusively from output stage 103. Output stage 103 and output stage 104 are further configured to provide a second current to output node 105 exclusively from the output stage 104 when the magnitude of the voltage on output node 105 is above a second value greater than the first value. As illustrated in FIG. 2A, when the voltage on output node 105 is greater than +V2 or less than −V2 (e.g., at regions 202A-B), current into output node 105 is exclusively from output stage 104. Output stage 103 and output stage 104 are further configured to provide a third current to output node 105 from both output stage 103 and output stage 104 when the magnitude of the voltage on the output node 105 is between the first value and the second value. Referring again to FIG. 2A, when the voltage on output node 105 is greater than +V1 and less than +V2 or less than −V1 and greater than −V2 (e.g., at regions 203A-B), current into output node 105 is provided from output stage 103 and output stage 104.

FIG. 2B illustrates another aspect of the operation of amplifier circuit 100 according to a particular embodiment. In one embodiment, as the magnitude of the output voltage changes, output stages 103 and 104 may be progressively deactivated/reactivated across a first range of voltages, and output stages 103 and 104 may be turned off at particular voltages. For example, in region 204 of FIG. 2B below voltage +V4 and above voltage −V4, output stage 103 may be on and output stage 104 may be turned off and current to output node 105 is received only from output stage 103. As the magnitude of the voltage on the output node increases from zero (e.g., in either the positive or negative direction), switching stage 110 may progressively reduce current from output stage 103 as the magnitude of the voltage on the output node 105 increases above +V1 or below −V1. When the magnitude of the voltage on the output node 105 increases to +/−V3, switching stage 110 turns off output stage 103. In one embodiment, hard switching at +/−V3 occurs at the same voltage as soft switching at +/−V2 (+/−V3=+/−V2), and output stage 103 turns off at +/−V2 to improve power dissipation and distortion. Conversely, output stage 104 may progressively turn on as the magnitude of the voltage on output node 105 increases across region 203A-B of FIG. 2A. Similarly, in regions 205A-B of FIG. 2B above voltage +V3 and below voltage −V3, output stage 104 may be on and output stage 103 may be turned off and current to output node 105 is received only from output stage 104. As the magnitude of the voltage on the output node 105 decreases from a maximum value (e.g., decreases from +/−Vdd2 in the positive or negative direction, respectively), switching stage 110 may progressively reduce current from output stage 104 as the magnitude of the voltage on the output node 105 decreases below +V2 or above −V2. When the magnitude of the voltage on the output node 105 decreases to +/−V4, switching stage 110 turns off output stage 104. Conversely, output stage 103 may progressively turn on as the magnitude of the voltage on output node 105 decreases across region 203A-B of FIG. 2A.

Figure 3:
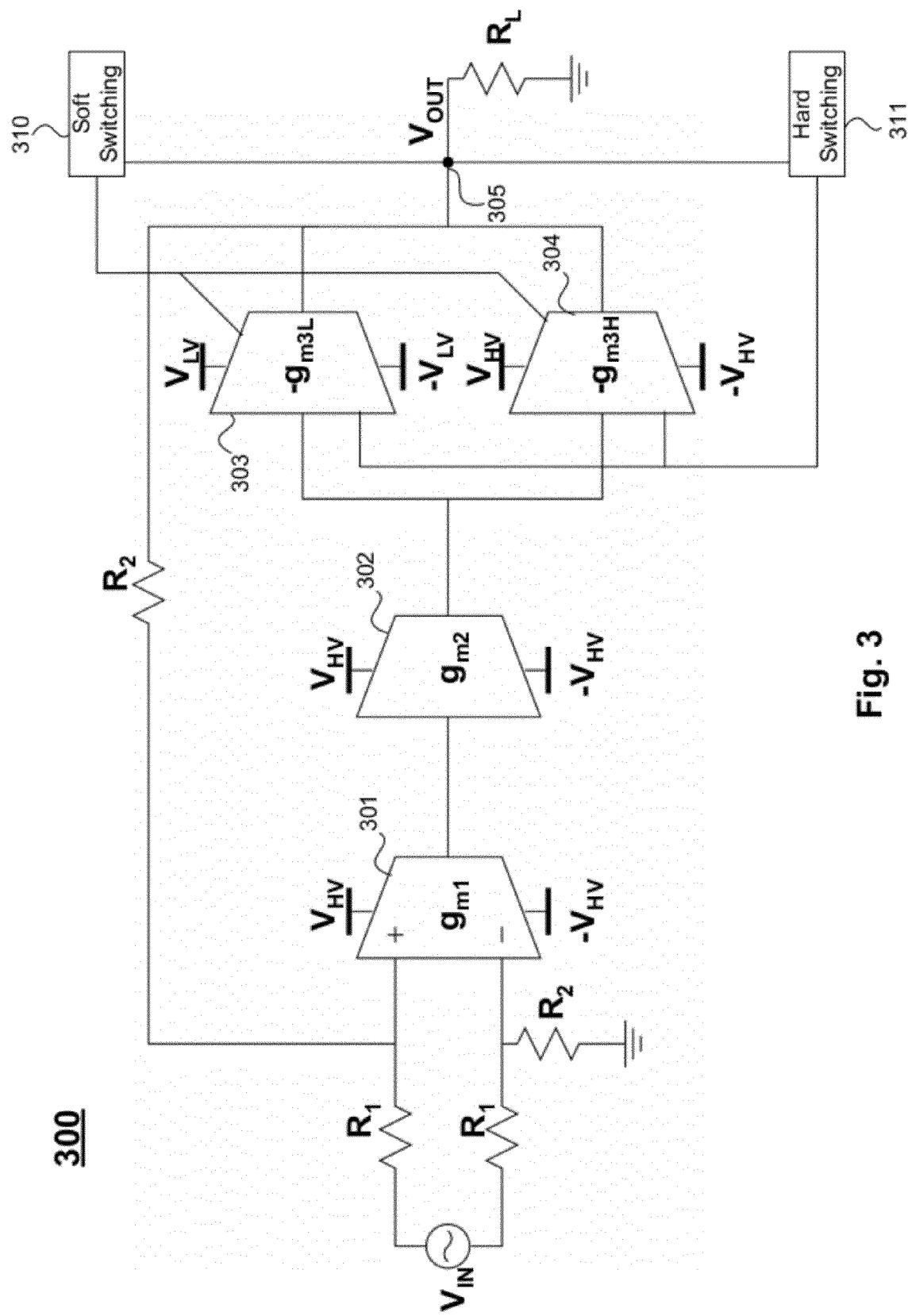
FIG. 3 illustrates an example amplifier circuit according to another embodiment.

FIG. 3 illustrates an example amplifier circuit 300 according to another embodiment. Amplifier circuit 300 is implemented using transconductance stages 301-304. A differential input signal is coupled to an input of an input stage 301 through two resistors having the same value, R1. Input stage 301 is powered by supply voltages $V_{HV}$ and $-V_{HV}$. An output of input stage 301 is coupled to an input of intermediate stage 302, which is also powered by supply voltages $V_{HV}$ and $-V_{HV}$. An output of intermediate stage 302 is coupled to a low voltage output stage 303 and a high voltage output stage 304. Low voltage output stage 303 is powered by supply voltages $V_{LV}$ and $-V_{LV}$, and high voltage output stage 304 is powered by supply voltages $V_{HV}$ and $-V_{HV}$. Output terminals of output stages 303 and 304 are coupled to an output node 305 to provide a voltage, Vout, to a load represented here by resistor, $R_L$. This example includes a soft switching circuit 310 and a hard switching circuit 311. Soft switching circuit 310 progressively reduces current from one output stage and progressively increases current from the other output stage based on the voltage on output node 305 as illustrated in FIG. 2A. Hard switching circuit 311 turns off output stage 303 when the magnitude of the voltage on the output node 305 increases above +/−V3 and turns off output stage 304 when the magnitude of the voltage on the output node 305 decreases below +/−V4 as illustrated in FIG. 2B. Amplifier circuit 300 is configured in a feedback loop with a feedback resistor, R2, coupled between output node 305 and one input of input stage 301. A second input of input stage 301 is coupled to ground using another resistor having the same value, R2, as the feedback resistor.

Figure 4:
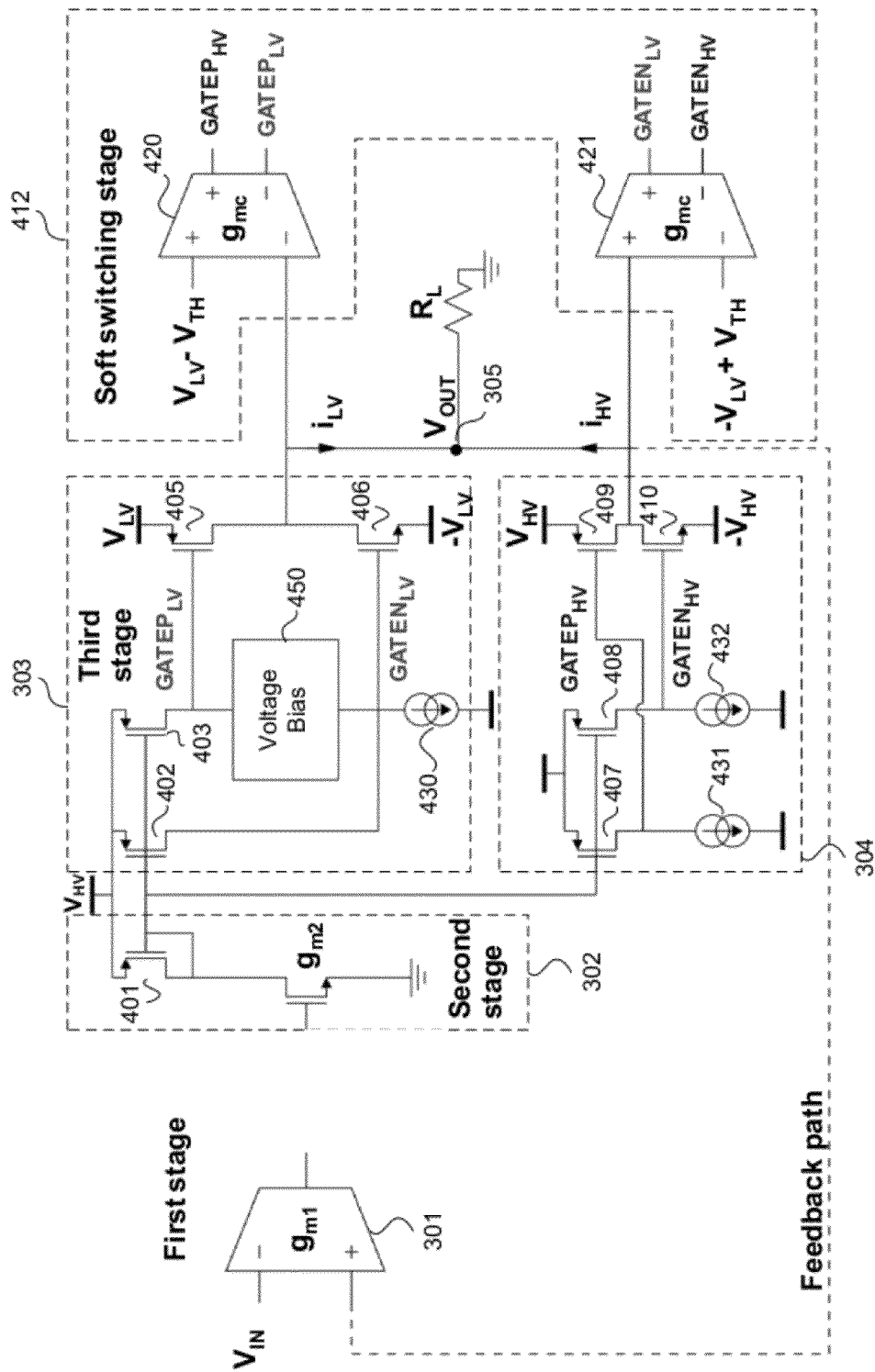
FIG. 4 illustrates an example implementation of an amplifier circuit according to one embodiment.

FIG. 4 illustrates an example implementation of amplifier circuit 300 according to one embodiment. In this example, an output of a transconductance input stage 301 is coupled to a second stage 302 including an NMOS transistor, gm2, having a current mirror load. A gate of gm2 is coupled to an output of input stage 301. A source of gm2 is coupled to ground and a drain is coupled to a current mirror load including PMOS transistors 401, 402, 403, 407, and 408. Input signal Vin is amplified by input stage 301. Intermediate stage 302 converts the voltage signal into four current signals. Two current signal are coupled to output stage 303 through current mirror transistors 402 and 403. Similarly, two current signals are coupled to output stage 304 through current mirror transistors 407 and 408. Output stage 303 is powered by supply voltages $V_{LV}$ and $-V_{LV}$ and includes an active voltage bias circuit 450, current source 430, output transistor 405, and output transistor 406 described in more detail below. Output stage 304 is powered by supply voltages $V_{HV}$ and $-V_{HV}$ and includes current source 431, current source 432, output transistor 409, and output transistor 410 as described in more detail below.

In this example, output stages 303 and 304 are coupled to a soft switching stage 412 comprising transconductance switching circuit 420 and transconductance switching circuit 421, for example. Switching circuit 420 includes one input coupled to output node 305 to receive a voltage and another input coupled to receive a first reference voltage. In this example, the first reference voltage is generated from the positive voltage $V_{LV}$ of the first power supply voltages minus a threshold voltage, Vth. A first output, $GATEP_{HV}$, of switching circuit 420 is coupled to the gate of PMOS transistor 409 in output stage 304 and a second output, $GATEP_{LV}$, of switching circuit 420 is coupled to the gate of PMOS transistor 405 in output stage 303. Similarly, switching circuit 421 includes one input coupled to output node 305 to receive a voltage and another input coupled to receive a second reference voltage. In this example, the second reference voltage is generated from the negative voltage $-V_{LV}$ of the first power supply voltages plus a threshold voltage, Vth. A first output, $GATEN_{HV}$, of switching circuit 421 is coupled to the gate of NMOS transistor 410 in output stage 304 and a second output, $GATEN_{LV}$, of switching circuit 421 is coupled to the gate of NMOS transistor 406 in output stage 303. As the voltage on output node 305 changes, switching circuit 420 steers current between PMOS transistors 405 and 409 to progressively increase/decrease the voltage on each transistor's gate terminal and thereby alternatively deactivate/activate PMOS transistors 405 or 409. Similarly, as the voltage on output node 305 changes, switching circuit 421 steers current between NMOS transistors 406 and 410 to progressively decrease/increase the voltage on each transistor's gate terminal and thereby alternatively activate/deactivate NMOS transistors 406 or 410.

Figure 5:
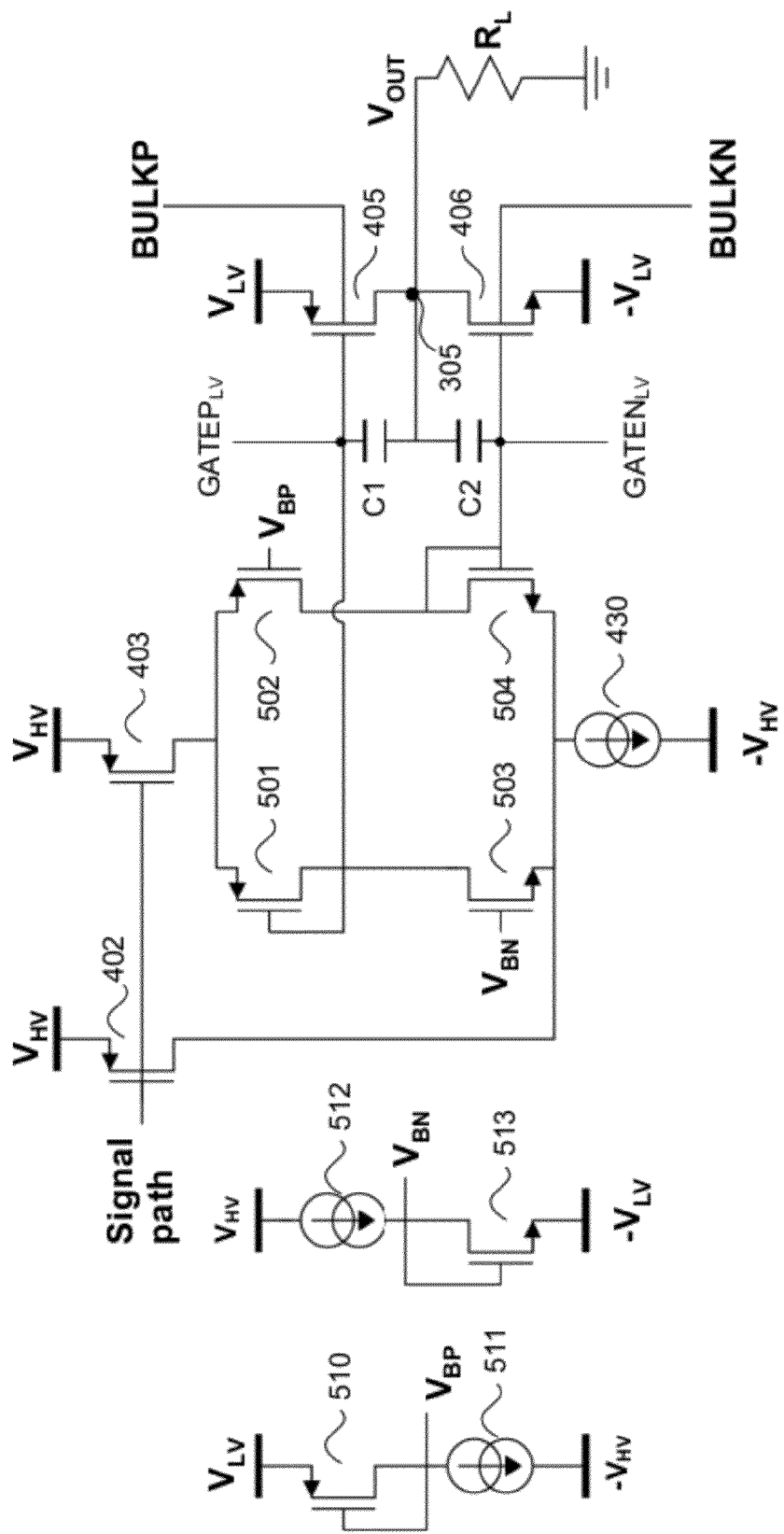
FIG. 5 illustrates an example low voltage output stage according to one embodiment.

FIG. 5 illustrates an example low voltage output stage 303 according to one embodiment. As described above, the signal is received through current mirror transistors 402 and 403. As shown in FIG. 4, output stage 303 includes an active voltage bias circuit 450 for establishing a bias voltage across the gate of transistor 405 and the gate of transistor 406. Active voltage bias circuit 450 includes differentially configured transistors 501-504 arranged to form a floating battery. Transistor 402 produces a current into the sources of transistors 503 and 504, and transistor 403 produces a current into the sources of transistors 501 and 502. Increases and decreases in the currents from transistors 402 and 403 increase or decrease the voltages at the gates of output transistors 405 and 406. The gate of transistor 502, $V_{BP}$, is biased by a translinear loop bias circuit comprising PMOS transistor 510 and current source 511. Similarly, the gate of transistor 503, $V_{BN}$, is biased by a translinear loop bias circuit comprising NMOS transistor 513 and current source 512. The gate of transistor 405 is coupled to the $GATEP_{LV}$ output of switching circuit 420 and to the output node 305 using capacitor C1. Similarly, the gate of transistor 406 is coupled to the $GATEN_{LV}$ output of switching circuit 421 and to the output node 305 using capacitor C2. Configurations for bulk material BULKP and BULKN for transistors 405 and 406 according to a particular embodiment are described in more detail below.

Figure 6:
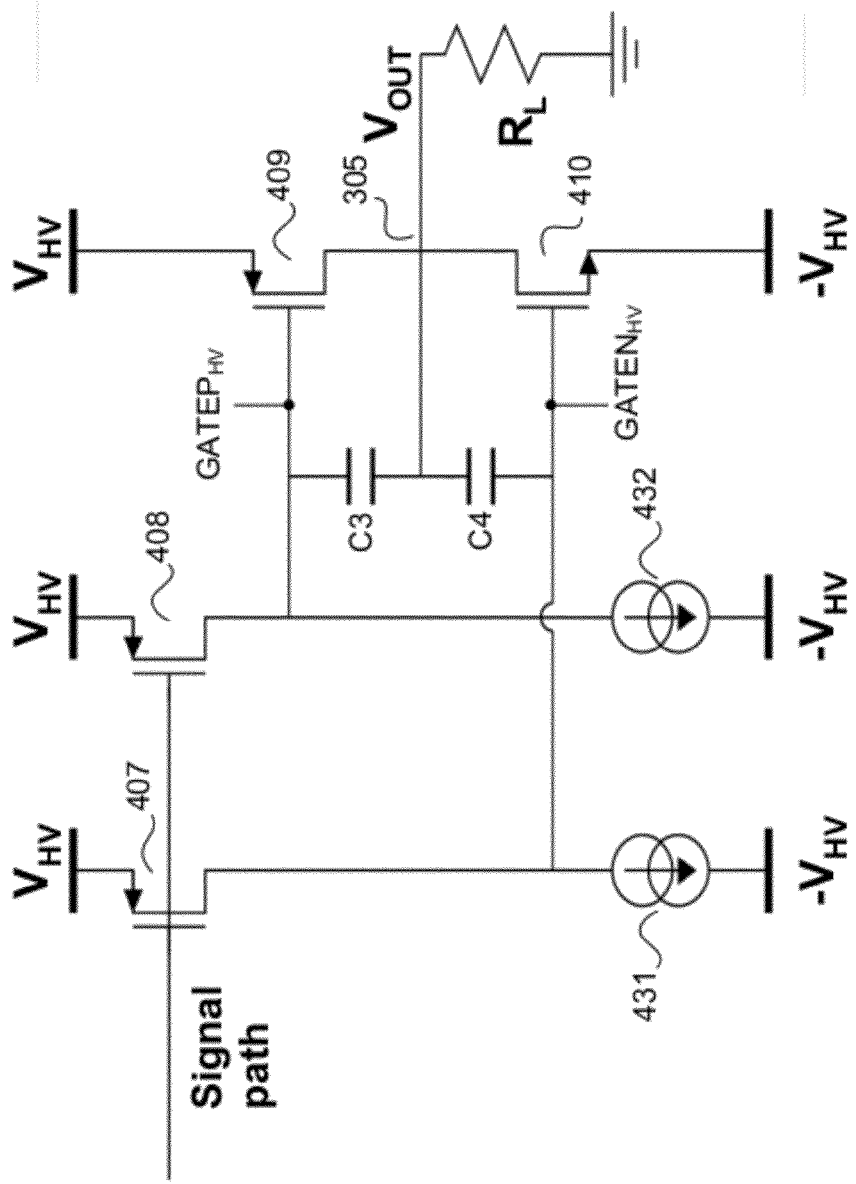
FIG. 6 illustrates an example high voltage output stage according to one embodiment.

FIG. 6 illustrates an example high voltage output stage 304 according to one embodiment. As described above, the signal is received through current mirror transistors 407 and 408. In particular embodiments, high voltage output stage 304 is turned off when the magnitude of the voltage on the output node 305 is less than a particular value (e.g., +/−V4) and may progressively turn on above another value (e.g., +/−V1). Accordingly, there is no zero crossing, and no need for active voltage biasing at the gates of transistors 409 and 410. Therefore, output transistors 409 and 410 may be biased by previous stages. For example, output stage 304 includes current source 431 and a gate of transistor 410 coupled to an output of transistor 407 and current source 432 and a gate of transistor 409 coupled to an output of transistor 408. The gate of transistor 409 is coupled to output node 305 through capacitor C3 and the gate of transistor 410 is coupled to output node 305 through capacitor C4. The gate of transistor 409 is coupled to the $GATEP_{HV}$ output of switching circuit 420. Similarly, the gate of transistor 410 is coupled to the $GATEN_{HV}$ output of switching circuit 421.

Figure 7:
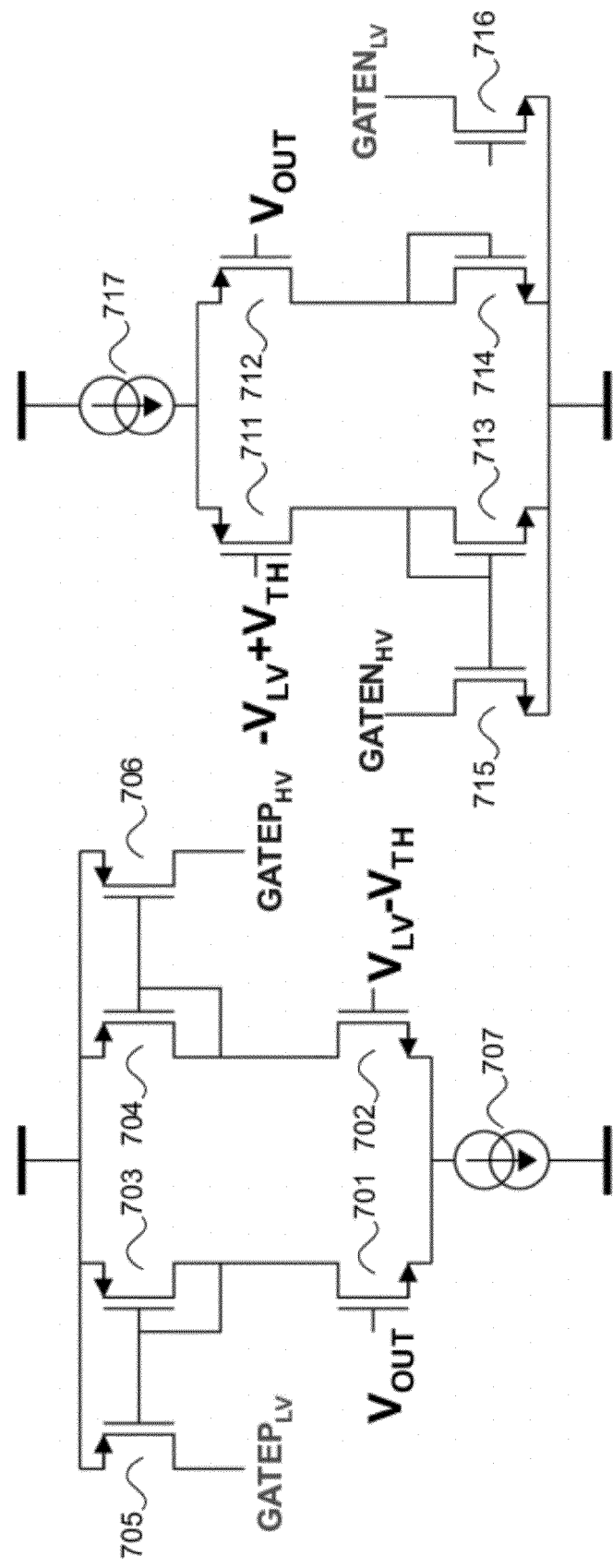
FIGS. 7A-B illustrate example soft switching circuits according to one embodiment.

FIGS. 7A-B illustrate example soft switching circuits according to one embodiment. In this example, first differential transistors 701 and 702 receive a voltage on the output node, Vout, and a first reference voltage. In this case, the first reference voltage is generated from the positive power supply voltage $V_{LV}$ minus a threshold voltage, Vth. Differential transistors 701 and 702 steer current from a current source 707 to a gate of either a PMOS transistor of the low voltage output stage 303 or a PMOS transistor of the high voltage output stage 304 to alternately and progressively turn off the transistors and reduce current into the output node. A first current mirror comprising transistors 703 and 705 is coupled between a first output of differential transistors 701 and 702, and a control input of PMOS output transistor 405 in output stage 303. A second current mirror comprising transistors 704 and 706 is coupled between a second output of differential transistors 701 and 702, and a control input of a PMOS output transistor 409 in output stage 304.

Similarly, second differential transistors 711 and 712 receive the voltage on the output node, Vout, and a second reference voltage. The second reference voltage is generated from a negative voltage of the first power supply voltages −$V_{LV}$ plus the threshold voltage, Vth. A third current mirror comprising transistors 714 and 716 are coupled between a first output of the second differential transistors and a control input of an NMOS output transistor 406 in output stage 303. A fourth current mirror comprising transistor 713 and 715 is coupled between a second output of the second differential transistors and a control input of an NMOS output transistor 410 in output stage 404. Differential transistors 711 and 712 steer current from a current source 717 to a gate of either NMOS transistor 406 of the low voltage output stage 303 or NMOS transistor 410 of the high voltage output stage 304 to alternately and progressively turn off the transistors and reduce current into the output node.

Figure 8:
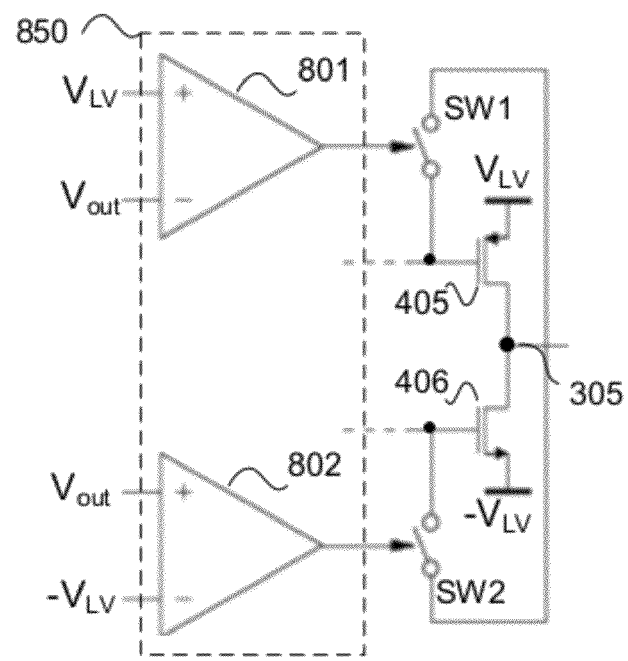
FIGS. 8-10 illustrate example hard switching circuits according to one embodiment.
Figure 9:
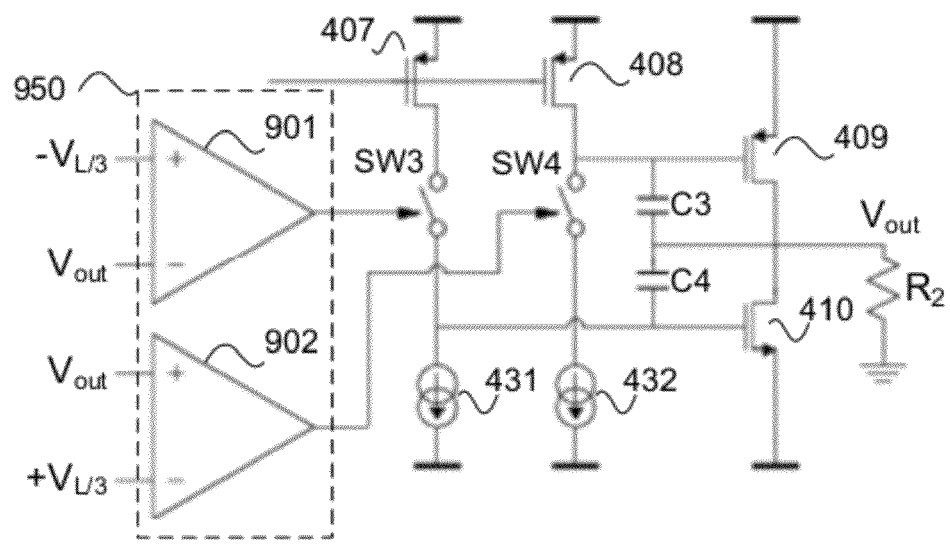
Figure 10:
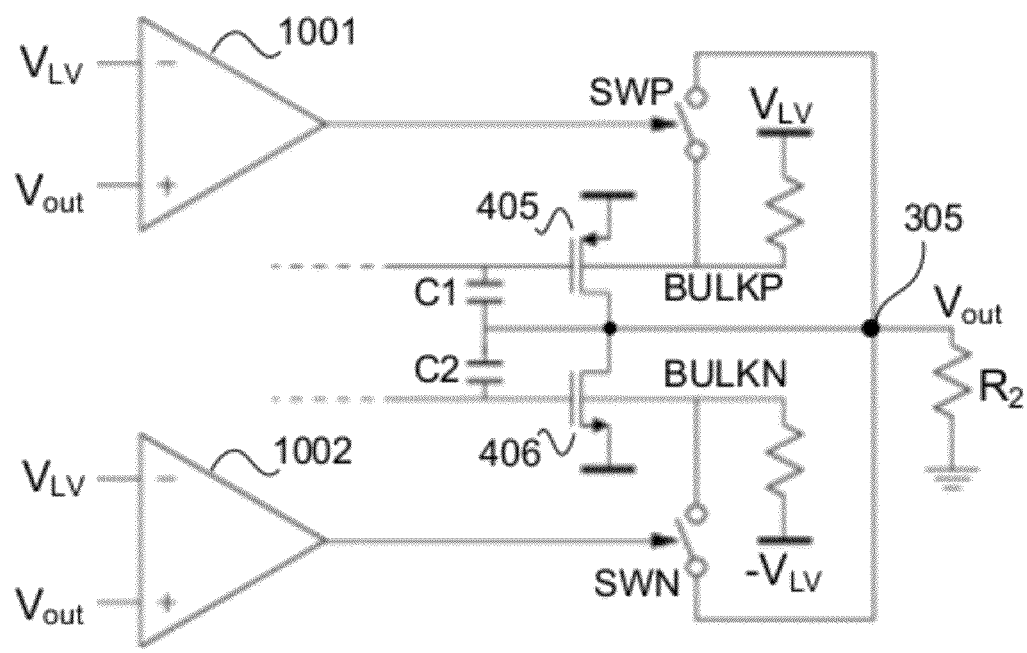

FIGS. 8-10 illustrate example hard switching circuits according to one embodiment.

FIG. 8 illustrates an example hard switching circuit for low voltage output stage 303. In this example, a gate of PMOS output transistor 405 may be coupled to output node 305 using switch SW1 and a gate of NMOS output transistor 406 may be coupled to output node 305 using switch SW2. Switches SW1 and SW2 are activated (opened and closed) using a window comparator 850 that receives the voltage on output node 305 and two reference voltages. In this example, window comparator 850 may include a first comparator 801 and a second comparator 802. Comparator 801 has a first input to receive the voltage, Vout, on output node 305 and a second input to receive a positive voltage, $V_{LV}$, of the power supply voltages for output stage 303, for example. Comparator 802 has a first input to receive the voltage, Vout, on output node 305 and a second input to receive a negative voltage, −$V_{LV}$, of the power supply voltages for output stage 303, for example. Comparator 801 turns off PMOS output transistor 405 in output stage 303 when Vout is greater than $V_{LV}$. Similarly, comparator 802 turns off NMOS output transistor 406 in the first output stage when Vout is less than −$V_{LV}$.

FIG. 9 illustrates an example hard switching circuit for high voltage output stage 304. In this example, a gate of PMOS output transistor 409 may be decoupled from current source 432 using switch SW4 so that transistor 408 increases the voltage on the gate to turn PMOS output transistor 409 off. Similarly, a gate of NMOS output transistor 410 may be decoupled from current mirror transistor 407 using switch SW3 so that current source 431 decreases the voltage on the gate to turn NMOS output transistor 410 off Switches SW3 and SW4 are activated (opened and closed) using a window comparator 950 that receives the voltage, Vout, on output node 305 and two reference voltages. In this example, window comparator 950 may include a first comparator 901 and a second comparator 902. Comparator 901 has a first input to receive Vout and a second input to receive a first reference voltage, for example. Output stage 304 may be turned off when the magnitude of Vout is less than a value where the soft switching circuit 310 begins to turn off output stage 303 (e.g., less than the value of +/−V1 in FIG. 2). In this example, the first reference voltage is set to −$V_{LV}$/3. Similarly, comparator 902 has a first input to receive Vout and a second input to receive +$V_{LV}$/3. Comparator 901 opens switch SW3 and turns off NMOS output transistor 410 in output stage 304 when Vout is greater than −$V_{LV}$/3. Similarly, comparator 902 opens switch SW4 and turns off PMOS output transistor 409 in output stage 304 when Vout is less than +$V_{LV}$/3. Accordingly, PMOS output transistor 409 and NMOS output transistor 410 are turned off when Vout is between +/−$V_{LV}$/3, which is a region of operation where low voltage output stage is turned on.

FIG. 10 illustrates an example bulk switching circuit for low voltage output stage 303. In this example, a bulk material of the output transistors 405 and 406 are coupled to low voltage supplies +/−$V_{LV}$ or to the output node 305 according to the voltage value on node 305. MOS transistors typically have a doped material under a gate of the device. Bulk material refers to the material under the gate of the MOS device. Changing a voltage on the material under the gate changes the threshold voltage of the device as well as other properties, for example. In this example embodiment, when the voltage value of node 305 is lower than $V_{LV}$ and higher than −$V_{LV}$ the bulk material of PMOS output transistor 405 is connected to $V_{LV}$ and bulk material of NMOS output transistor 406 is connected to −$V_{LV}$. To avoid direct conduction of the diodes associated with drain-bulk junctions when voltage on node 305 exceeds +$V_{LV}$ or −$V_{LV}$, comparator 1001 selectively couples bulk material of PMOS output transistor 405 ("BULKP") to output node 305 using switch SWP when Vout is greater than $V_{LV}$ and comparator 1002 selectively couples a bulk material of NMOS output transistor 406 ("BULKN") to output node 305 using switch SWN when Vout is less than −$V_{LV}$.

Figure 11:
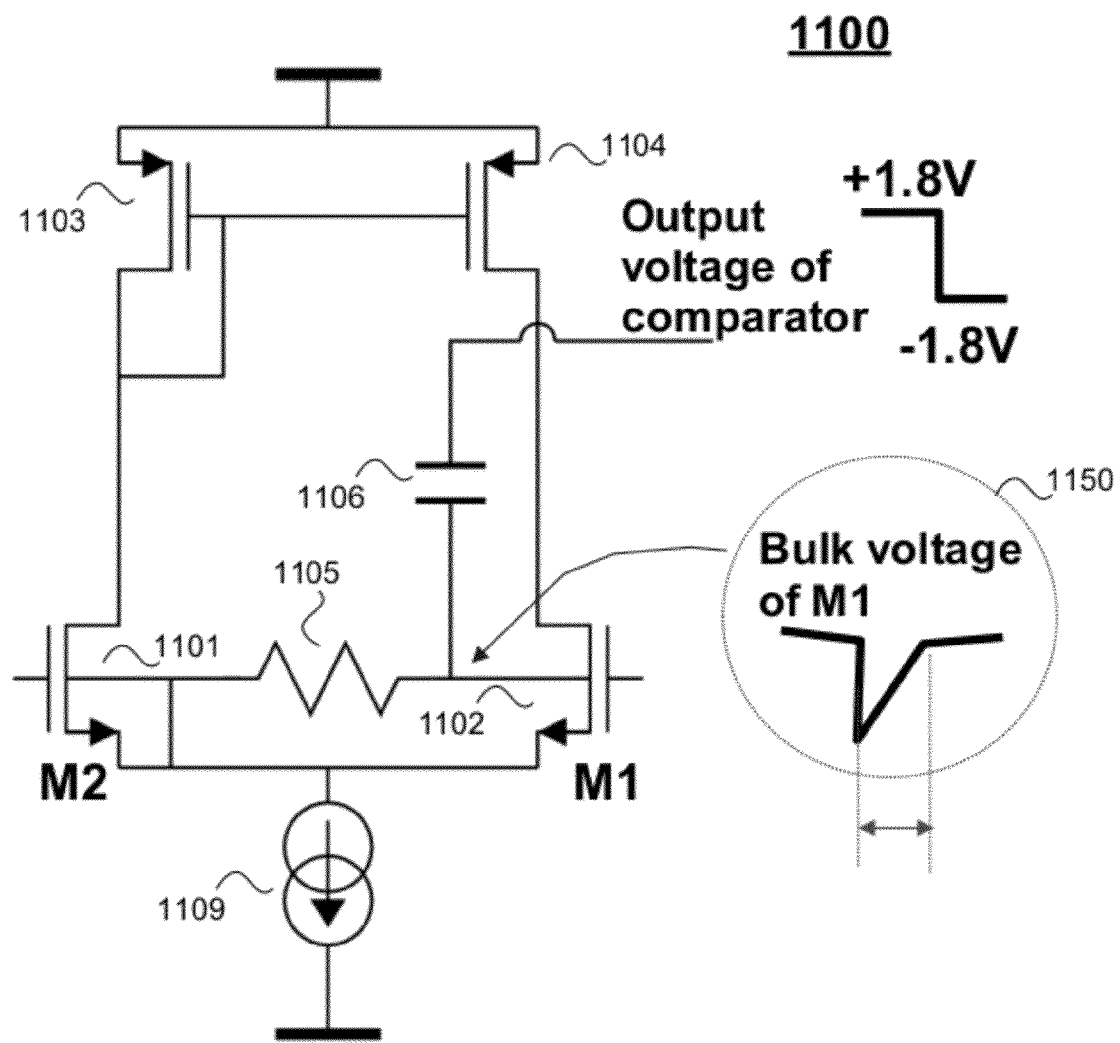
FIG. 11 illustrates an example through current control circuit according to one embodiment.

FIG. 11 illustrates an example hysteretic comparator input stage 1100 according to one embodiment. Hysteretic comparator input stage 1100 may be used to implement comparators 801, 802, 1001, and 1002, for example in hard switching circuits for the low voltage output stage. In some implementations, the current injected by soft switching circuit 310 may be small in order to minimize distortion. However, at high frequencies a low voltage output stage may not be switched off when Vout increases above $V_{LV}$. Comparators 801 and 802, for example, may need to be very fast to switch off the low voltage output stage under some conditions. It may further be advantageous to reduce the offset in comparators 801 and 802 in order to minimize output glitches during hard switching off of a low voltage output stage. Offset may further cause oscillations in the comparator outputs when the outputs are close to the reference voltages. Accordingly, in one embodiment a hysteretic comparator input stage 1100 may hold the state of the comparator for a period of time after the switching occurs. Hysteretic comparator input stage 1100 includes differential transistors 1101 and 1102 having sources coupled to current source 1109 and drains coupled to current mirror load transistors 1103 and 1104. An RC network configured as a high pass filter is used to create an offset voltage for a period of time. In particular, a resistor 1105 is configured between the bulk materials of transistors 1101 and 1102. Capacitor 1106 is configured between the bulk material of transistor 1102 and an output of the comparator (not shown). It should be noted that comparators 801, 802, 1001, and 1002 may have an input stage 1100 and one or more subsequent stages before the output of the comparator. When the comparator output switches from high to low (e.g., +1.8 v to −1.8 v), the RC network creates a pulse at 1150 on the bulk material of transistor 1102. The threshold variation results in an offset between transistors 1101 and 1102 to hold the on state of the comparator for a time proportional to the product of the resistor value and capacitor value.

Figure 12:
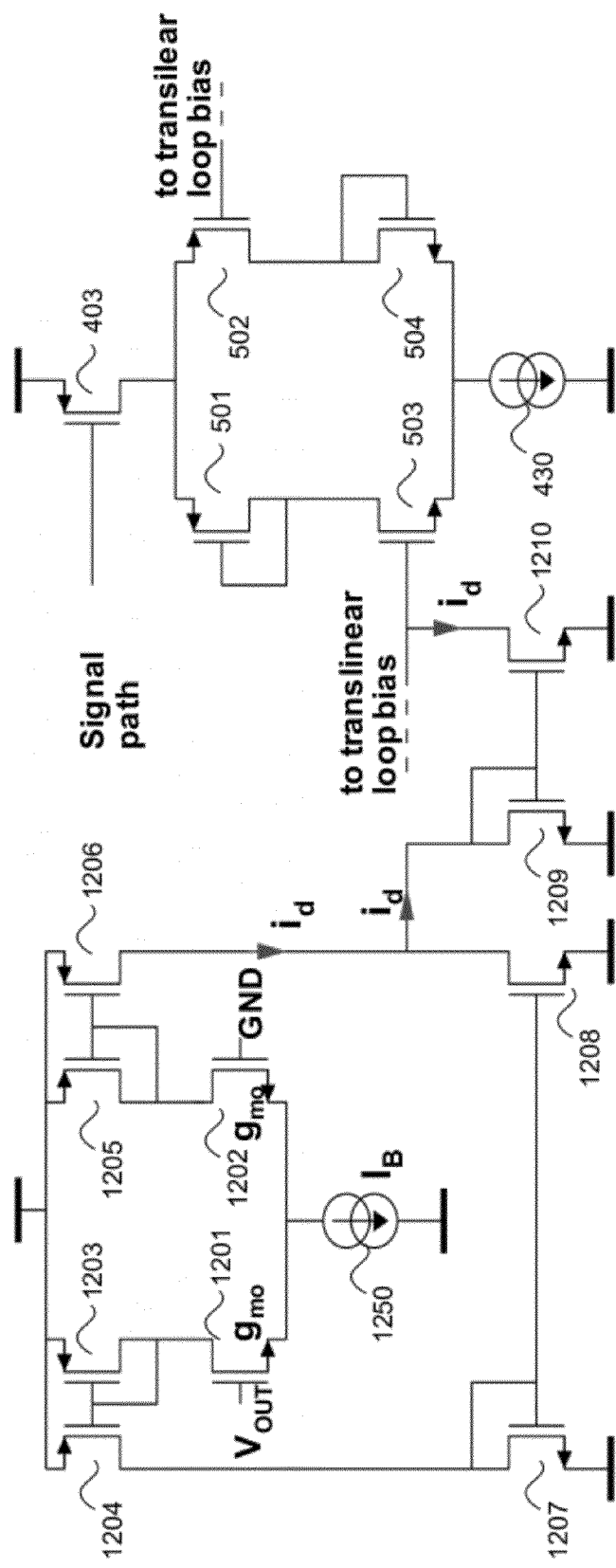
FIG. 12 illustrates an example hysteretic comparator according to one embodiment.

FIG. 12 illustrates an example through current control circuit 1200 according to one embodiment. Particular embodiments may include control circuits for reducing or entirely avoiding "through current." "Through current" refers to current flowing from the positive high voltage supply $V_{HV}$ to the negative low voltage supply −$V_{LV}$ or from the positive low voltage supply $V_{LV}$ to the negative high voltage supply −$V_{HV}$. In this example, active voltage bias circuit 450 of FIG. 4 is biased to clamp the gate of either the PMOS output transistor 405 or NMOS output transistor 406 in output stage 303. For instance, a bias circuit may include differential transistors 1201 and 1202 having sources coupled to a current source 1250 and drains coupled to current mirror loads comprising transistors 1203-1206. Output currents of the current mirror loads are combined in another current mirror comprising transistor 1207 and 1208. A difference current, id, is coupled through another current mirror comprising transistors 1209 and 1210 to the gate of transistor 503 in active voltage bias circuit 450. Differential transistors 1201 and 1202 generate difference current id based on a voltage on the output node 350 received on a gate of transistor 1201. The gate of transistor 1202 is coupled to ground. If Vout is less than ground, difference current id steals current from translinear bias current source 512 in FIG. 5 and turns off transistor 503, which clamps the gate voltage of PMOS output transistor 405. The result is that if Vout is less than ground, PMOS output transistor 405 is blocked from sourcing current into NMOS output transistor 410 in output stage 304. An inverse polarity through current control circuit (not shown) is coupled to the gate of transistor 502 to clamp the gate voltage of NMOS output transistor 406 when Vout is greater than ground. Accordingly, if Vout is greater than ground, NMOS output transistor 406 is blocked from sinking current from PMOS output transistor 409 in output stage 304.

Figure 13:
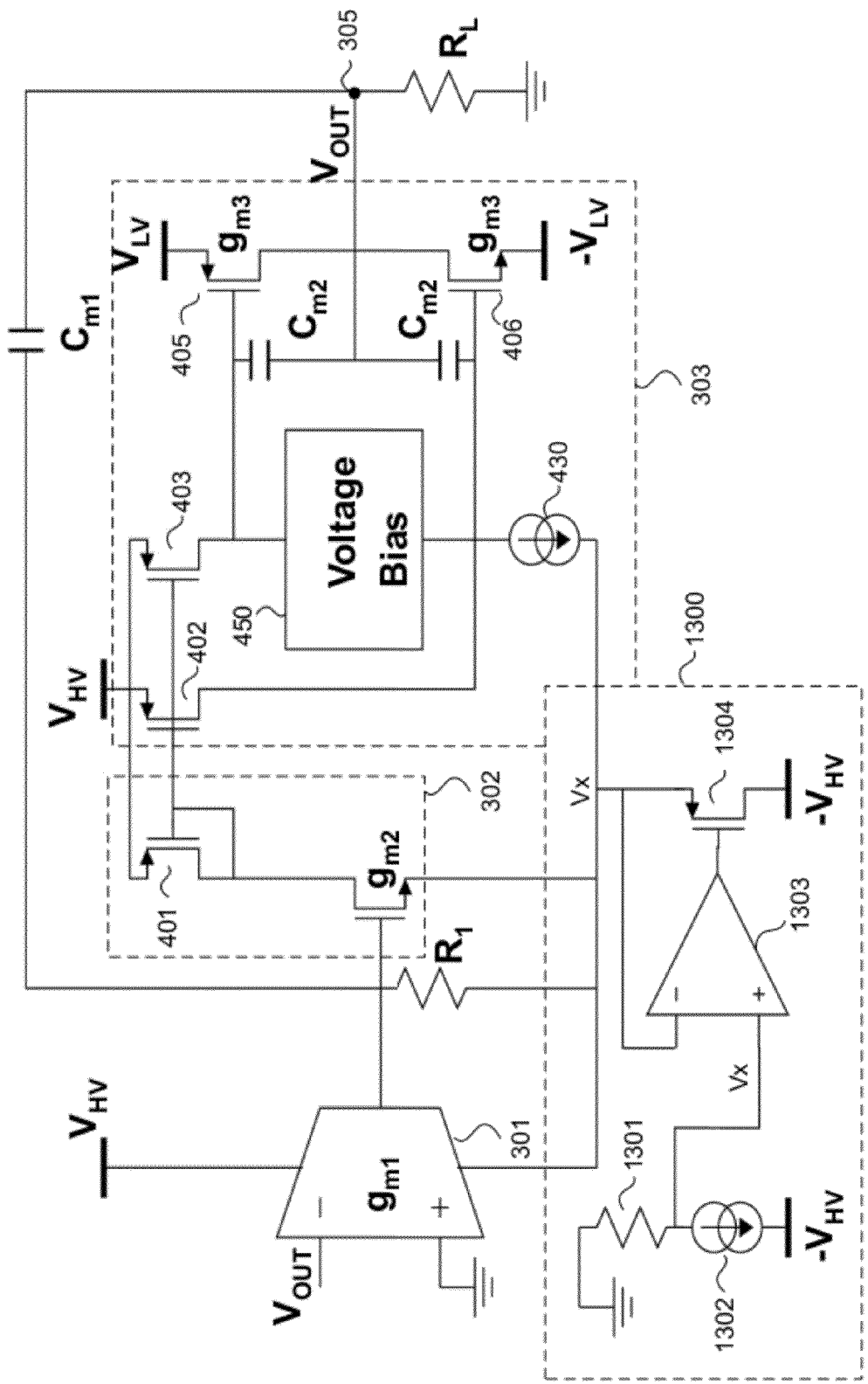
FIG. 13 illustrates an example circuit for reducing a power supply rejection ratio ("PSRR") according to one embodiment.

FIG. 13 illustrates an example circuit for reducing a power supply rejection ratio ("PSRR") according to one embodiment. Specifically, FIG. 13 illustrates an input stage 301, intermediate stage 302, and low voltage output stage 303 of an amplifier circuit 300 with a power supply rejection circuit 1300. Power supplies may have non-zero output impedance. If the PSRR value is low, the signal across the power supply resistances may be coupled with the output voltage and affect the linearity of amplifier 300. Particular implementations may include generating a clean ground for input stage 301 and intermediate stage 302. In this example, power supply rejection circuit 1300 includes a bias circuit comprising a resistor 1301 in series with a current source 1302 between ground and a negative voltage of the high voltage power supplies, $-V_{HV}$. A non-inverting input of an amplifier 1303 is coupled to a node between resistor 1301 and current source 1302, an output of amplifier 1303 is coupled to a gate of PMOS transistor 1304, and an inverting input of amplifier 1303 is coupled a source of PMOS transistor 1304. A drain of PMOS transistor 1304 is coupled to $-V_{HV}$. Accordingly, a clean voltage, Vx, may be created that is equal to a voltage at the non-inverting input of amplifier 1303, which is generated by resistor 1301 and current source 1302. Vx may be used as the lower power supply voltage for input stage 301, intermediate stage 302, and the active bias control circuit 450 in output stage 303 to reduce PSRR.

Figure 14:
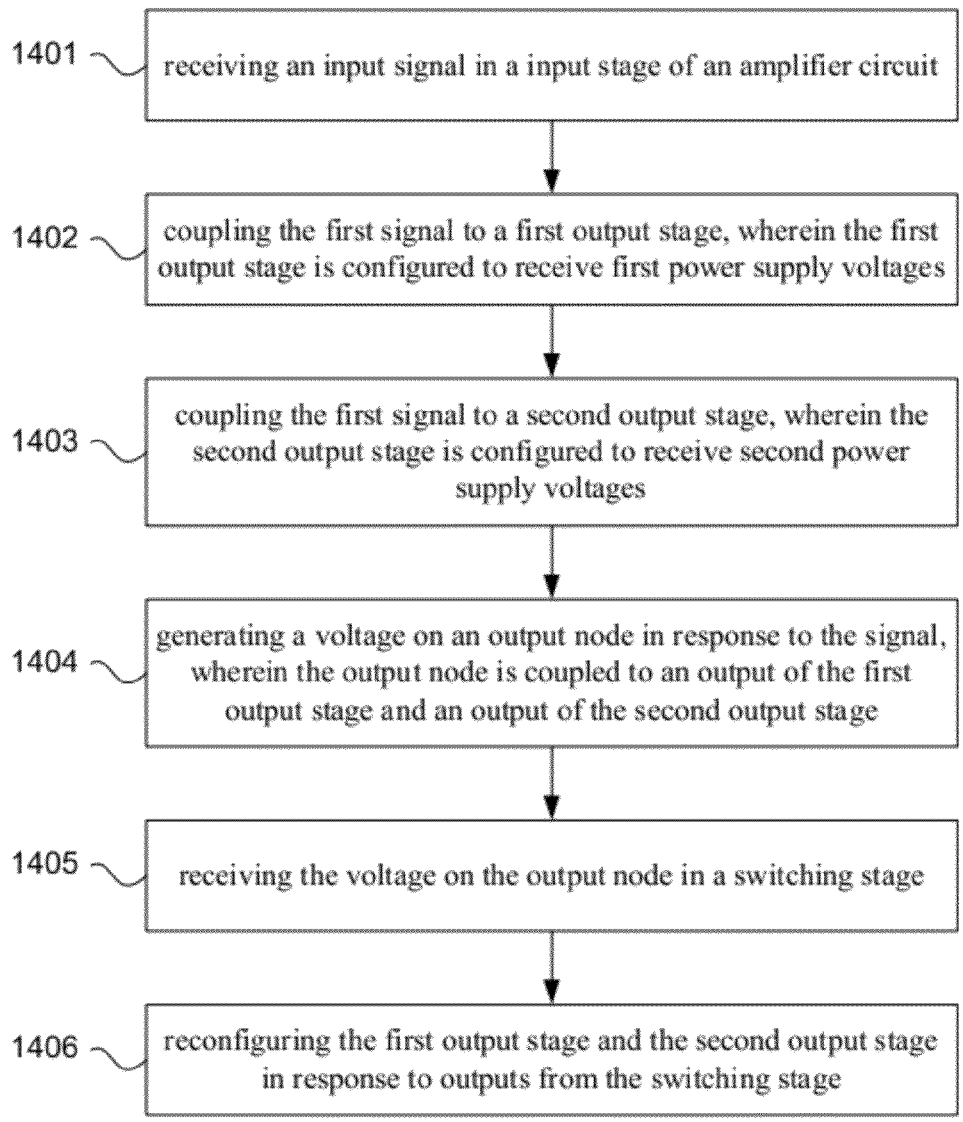
FIG. 14 illustrates a method of amplifying a signal according to one embodiment.

FIG. 14 illustrates a method of amplifying a signal according to one embodiment. At 1401, a signal is received in an input stage of an amplifier circuit. At 1402, the signal is coupled to a first output stage. The first output stage is configured to receive first power supply voltages, $+/-V_{LV}$. At 1403, the signal is coupled to a second output stage. The second output stage is configured to receive second power supply voltages, $+/-V_{HV}$. A voltage difference between $+/-V_{LV}$ is less than a voltage difference between $+/-V_{HV}$. At 1404, a voltage on an output node is generated in response to the signal, where the output node is coupled to an output of the first output stage and an output of the second output stage. At 1405, the voltage on the output node is received in a switching stage. At 1406, the first output stage and the second output stage are reconfigured in response to outputs from the switching stage. For instance, the first output stage and second output stage are configured to provide a first current to the output node exclusively from the first output stage when a magnitude of a voltage on the output node is below a first value. Additionally, the first output stage and second output stage are configured to provide a second current to the output node exclusively from the second output stage when the magnitude of the voltage on the output node is above a second value greater than the first value. Finally, the first output stage and second output stage are configured to provide a third current to the output node from both the first output stage and the second output stage when the magnitude of the voltage on the output node is between the first value and the second value.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, while the above embodiments have been disclosed using PMOS and NMOS, other embodiments may use other types of transistors. As a further example, one or more steps of methods or processes discussed above may be performed in a different order (or concurrently) and still achieve desirable results. Based on the above disclosure and the following claims, other arrangements, embodiments, implementations and equivalents may be employed without departing from the scope of the invention as defined by the claims.

What is claimed is:

1. An amplifier circuit comprising:
a input stage to receive an input signal;
a first output stage coupled to a first output of the input stage, wherein the first output stage is configured to receive first power supply voltages;
a second output stage coupled to the first output of the input stage, wherein the second output stage is configured to receive second power supply voltages, wherein a first voltage difference between the first power supply voltages is less than a second voltage difference between the second power supply voltages;
an output node coupled to an output of the first output stage and an output of the second output stage; and
a switching stage to provide outputs to the first output stage and the second output stage to configure the first output stage and the second output stage to provide a first current to the output node exclusively from the first output stage when a magnitude of a voltage on the output node is below a first value, provide a second current to the output node exclusively from the second output stage when the magnitude of the voltage on the output node is above a second value greater than the first value, and provide a third current to the output node from both the first output stage and the second output stage when the magnitude of the voltage on the output node is between the first value and the second value.

2. The circuit of claim 1, wherein the switching stage comprises:
a soft switching circuit to progressively turn off the first output stage and the second output stage based on the voltage on the output node; and
a hard switching circuit to turn off the first output stage and the second output stage based the voltage on the output node.

3. The circuit of claim 2, wherein the soft switching circuit progressively reduces current from the first output stage as the magnitude of the voltage on the output node increases above the first value and progressively reduces current from the second output stage as the magnitude of the voltage on the output node decreases below the second value greater than the first value.

4. The circuit of claim 3, wherein the hard switching circuit turns off the first output stage when the magnitude of the voltage on the output node is greater than a third value greater than the first value and turns off the second output stage when the magnitude of the voltage on the output node is less than or equal to a fourth value less than the first value.

5. The circuit of claim 2, wherein the soft switching circuit comprises:
   first differential transistors to receive the voltage on the output node and a first reference voltage, wherein the first reference voltage is generated from a positive voltage of the first power supply voltages minus a threshold voltage;
   a first current mirror coupled between a first output of the first differential transistors and a control input of a first output transistor in the first output stage between the positive voltage of the first power supply voltages and the output node;
   a second current mirror coupled between a second output of the first differential transistors and a control input of a second output transistor in the second output stage between the positive voltage of the second power supply voltages and the output node;
   second differential transistors to receive the voltage on the output node and a second reference voltage, wherein the second reference voltage is generated from a negative voltage of the first power supply voltages plus the threshold voltage;
   a third current mirror coupled between a first output of the second differential transistors and a control input of a third output transistor in the first output stage between a negative voltage of the first power supply voltages and the output node; and
   a fourth current mirror coupled between a second output of the second differential transistors and a control input of a fourth output transistor in the second output stage between a negative voltage of the second power supply voltages and the output node.

6. The circuit of claim 2, wherein the hard switching circuit comprises:
   a first comparator having a first input to receive the voltage on the output node and a second input to receive a positive voltage of the first power supply voltages; and
   a second comparator having a first input to receive the voltage on the output node and a second input to receive a negative voltage of the first power supply voltages,
   wherein the first comparator turns off a first output transistor in the first output stage when the voltage on the output node is greater than the positive voltage of the first power supply voltages,
   and wherein the second comparator turns off a second output transistor in the first output stage when the voltage on the output node is less than the negative voltage of the first power supply voltages.

7. The circuit of claim 6, wherein the first and second comparators are hysteretic comparators.

8. The circuit of claim 6, wherein the first comparator selectively couples a first bulk material of the first output transistor to the output node when the voltage on the output node is greater than the positive voltage of the first power supply voltages, and wherein the second comparator selectively couples a second bulk material of the second output transistor to the output node when the voltage on the output node is less than the negative voltage of the first power supply voltages.

9. The circuit of claim 2, wherein the hard switching circuit comprises:
   a first comparator having a first input to receive the voltage on the output node and a second input to receive a first voltage less than or equal to the first value; and
   a second comparator having a first input to receive the voltage on the output node and a second input to receive a second voltage equal to a negative of the first voltage,
   wherein the first comparator turns off a first output transistor in the second output stage when the voltage on the output node is less than the first voltage,
   and wherein the second comparator turns off a second output transistor in the second output stage when the voltage on the output node is greater than the second voltage.

10. The circuit of claim 1, wherein the first output stage and the second output stage inject current into the output node.

11. The circuit of claim 1, wherein the first output stage comprises a first PMOS transistor and a first NMOS transistor configured in series between the first power supply voltages, the second output stage comprises a second PMOS transistor and a second NMOS transistor configured in series between the second power supply voltages, and the switching stage comprises a first differential transistor circuit, a second differential transistor circuit, and a plurality of comparators.

12. The circuit of claim 1, wherein the first output stage comprises a first transistor of first conductivity type and a second transistor of second conductivity type configured in series between the first power supply voltages, wherein first transistor and second transistor are biased by an active voltage bias circuit configured between a control terminal of the first transistor and a control terminal of the second transistor, and wherein the second output stage comprises a third transistor of first conductivity type and a fourth transistor of second conductivity type configured in series between the second power supply voltages, wherein third transistor and fourth transistor are biased by one or more previous stages.

13. The circuit of claim 1, further comprising one or more intermediate stage between the input stage and the first and second output stages.

14. The circuit of claim 1, wherein the first output stage comprises a clamped active voltage bias circuit.

15. The circuit of claim 1, wherein the switching stage comprises an input coupled to the output node.

16. An electronic system comprising an audio amplifier, the audio amplifier comprising the circuit of claim 1.

17. A method comprising:
   receiving a signal in an input stage of an amplifier circuit;
   coupling the signal to a first output stage, wherein the first output stage is configured to receive first power supply voltages;
   coupling the signal to a second output stage, wherein the second output stage is configured to receive second power supply voltages, and wherein a first voltage difference between the first power supply voltages is less than a second voltage difference between the second power supply voltages;
   generating a voltage on an output node in response to the signal, wherein the output node is coupled to an output of the first output stage and an output of the second output stage;
   receiving the voltage on the output node in a switching stage; and reconfiguring the first output stage and the second output stage in response to outputs from the switching stage, wherein the first output stage and the second output stage are configured to provide a first current to the output node exclusively from the first output stage when a magnitude of a voltage on the output node is below a first value, wherein the first output stage and the second output stage are configured to provide a second current to the output node exclusively from the second output stage when the magnitude of the voltage on the output node is above a second value greater than the first value, and wherein the first output stage and the second output stage are configured to provide a third current to the output node from both the first output stage and the second output stage when the magnitude of the voltage on the output node is between the first value and the second value.

18. The method of claim 17, further comprising:

progressively reducing current from the first output stage as the magnitude of the voltage on the output node increases above the first value; and progressively reducing current from the second output stage as the magnitude of the voltage on the output node decreases below the second value greater than the first value.

19. The method of claim 18, further comprising:

turning off the first output stage when the magnitude of the voltage on the output node is greater than a third value greater than or equal to the first value; and turning off the second output stage when the magnitude of the voltage on the output node is less than or equal to a fourth value less than the first value.

20. The method of claim 17, further comprising:

receiving the voltage on the output node and a first reference voltage in a first differential circuit;

mirroring current to a control terminal of a first PMOS transistor in the first output stage and a control terminal of a second PMOS transistor in the second output stage based on the voltage on the output node;

receiving the voltage on the output node and a second reference voltage in a second differential circuit; and mirroring current to a control terminal of a first NMOS transistor in the first output stage and a control terminal of a second NMOS transistor in the second output stage based on the voltage on the output node.

21. The method of claim 17, further comprising:

receiving the voltage on the output node, a first reference voltage, and a second reference voltage in a first window comparator circuit, wherein the first reference voltage is greater than the second reference voltage;

turning off a first PMOS transistor in the first output stage when the voltage on the output node is above the first reference voltage and turning off a first NMOS transistor in the first output stage when the voltage on the output node is below the second reference voltage;

receiving the voltage on the output node, a third reference voltage, and a fourth reference voltage in a second window comparator circuit, wherein the third reference voltage is greater than the fourth reference voltage; and turning off a second PMOS output transistor and a second NMOS transistor in the second output stage when the voltage on the output node is between the third reference voltage and the fourth reference voltage.

* * * * *